United States Patent
DeVries

[11] 4,004,254
[45] Jan. 18, 1977

[54] SWIF WITH SIDE LOBE COMPENSATION BARRIER

[75] Inventor: Adrian J. DeVries, Elmhurst, Ill.

[73] Assignee: Zenith Radio Corporation, Chicago, Ill.

[22] Filed: Apr. 3, 1975

[21] Appl. No.: 564,940

[52] U.S. Cl. .............................. 333/30 R; 310/8.2; 310/9.8; 333/72

[51] Int. Cl.² ..................... H03H 9/26; H03H 9/30; H03H 9/32; H01L 41/10

[58] Field of Search ............ 333/30 R, 72; 310/8.1, 310/8.2, 9.7, 9.8

[56] References Cited
UNITED STATES PATENTS

| | | | |
|---|---|---|---|
| 3,548,306 | 12/1970 | Whitehouse | 333/30 R X |
| 3,559,115 | 1/1971 | DeVries | 333/72 |
| 3,701,147 | 10/1972 | Whitehouse | 333/30 R X |
| 3,836,876 | 9/1974 | Marshall et al. | 333/72 X |

Primary Examiner—Alfred E. Smith
Assistant Examiner—Marvin Nussbaum
Attorney, Agent, or Firm—Roy A. Ekstrand

[57] ABSTRACT

An acoustic surface wave filter comprises a piezoelectric substrate defining a propagating surface upon which a transmitting and receiving transducer pair are formed in offset alignment. An interposed multistrip coupler provides surface wave coupling between the offset transducers. An elongated isolating barrier is interposed between the transducers in an orthogonal relationship with the coupler to prevent surface wave propagation between the transducers along other than the primary axis. In one embodiment, an isolating barrier is composed of an acoustic surface wave dampening material, while in another a barrier of acoustic surface wave reflective material is used.

6 Claims, 3 Drawing Figures

SWIF WITH SIDE LOBE COMPENSATION BARRIER

BACKGROUND OF THE INVENTION

This invention relates generally to surface wave integratable filters (SWIF's) and in particular to those utilizing multistrip couplers (MSC).

SWIF devices comprise piezoelectric substrates upon which transmitting and receiving transducer pairs are formed. The transducers, whether receiving or transmitting, are typically formed by pairs of electrically conductive comb-like structures having interleaved fingers. When a voltage is applied between the comb-like structures of a transmitting transducer, the piezoelectric material of the substrate's surface is stressed and deformed causing a conversion of electrical energy to mechanical energy in the form of acoustic surface waves which propagate across the medium surface to impinge the receiving transducer. A second energy conversion takes place at the receiving transducer in which the mechanical energy of the acoustic surface wave is reconverted to electrical energy developing a voltage between comb elements.

While a simple single transducer section, formed by two adjacent fingers of one comb element and the interleaved finger of the other, is capable of launching or receiving surface waves, in practice many transducer sections are combined in a more complex transducer structure. In addition, the configurations of the transducer comb elements both as to finger lengths and spacing are selected to provide the desired transfer characteristic. In multiple section transducers such as are generally used, the total launched or received wave is the cumulative effect of the individual transducer sections. Transducers define a single maximum energy or primary propagation and reception axes; most propagation occurs along this axis, however, a small but significant amount is radiated into or recorded from other directions. Generally the primary axis is in essentially orthogonal alignment with the transducer fingers while these other energy transfer directions are then non-orthogonal.

As is well known, the fingers within the transducer sections are spaced upon the substrate such that certain frequency signals (near the transducer synchronous frequency, or maximum response) produce surface waves which are cumulatively reinforced as they propagate across the transducer structure (therefore maximally coupled) while others are cumulatively cancelled (and therefore attenuated). The typical transfer function of a SWIF with fingers of equal length and spacing comprises a sin x/x characteristic in which a major passband and adjacent traps or minima are defined together with successively diminished secondary passbands (called frequency side lobes) symmetrically spaced about the major passband.

As mentioned above, surface waves propagating in directions other than the primary axis, have lower energy. Further, wave energy not propagating along the primary axis in general does not have the same cumulative characteristic of the entire transducer structure but rather a portion of it. This is more evident in the commonly known apodized structure composed of transducer fingers which are length weighted as a function of the inverse fourier transform of the desired transfer function. As a result, the frequency response along other than the primary axis is different from that along the primary axis. In SWIF devices having the transmitting and receiving transducers "in line," that is, both transducers having common primary axes, surface waves propagated along other than the primary axis are generally not troublesome. Such in-line devices are, however, plagued by the effects of bulk mode wave propagation. Transducers produce both surface waves (propagating at or near the medium surface) and bulk mode waves (propagating deep within the medium). These bulk mode waves are undesirable in surface wave devices because they often reflect off substrate boundaries and impinge the receiving transducer causing spurious responses which often has a different time delay and exhibits a completely different frequency response.

In sidestepping SWIF devices in which the transducers are laterally offset, their primary axes are parallel but not coincident, and an interposed multistrip coupler is positioned orthogonal to the primary axes. Surface waves propagating along the primary axis of the transmitting transducer in its channel are "converted" to surface waves propagating along the primary axis of the offset receiving transducer in its channel. The purpose of offsetting the transmitting and receiving transducers and sidestepping wave propagation is to avoid the deleterious effect on the transfer function caused by the undesired bulk waves. Simply stated, the sidestepping effect of the multistrip coupler assures that surface waves launched by the transmitting transducer which are offset by the multistrip coupler reach the receiving transducer while bulk waves, which are not offset by the multistrip coupler do not.

It is known, however, that the transfer function of sidestepping devices differs from that which is theoretically predicted. In particular both the upper and lower side lobes adjacent the primary passband of the transfer function are considerably greater than anticipated. Also the depth of adjacent traps is considerably reduced from the predicted value. When, for example, the SWIF described is used as a passband filter the increased response of the side lobes relative to the primary passband response results in less attenuation of signals outside the passband (out-of-band signals) reducing filter selectivity. Further the reduced trap depth can result in insufficient rejection of undesired signals. It should be noted at this point that the offset position of the transducer generally results in some direct coupling of energy propagating along other than primary axis. Experiment has shown that one of the mechanisms contributing to transfer function disparity results from this direct coupling of energy via waves which impinge the multistrip coupler at an angle other than the 90° angle required for conversion and, therefore, are not sidestepped but pass directly through the coupler impinging the receiving transducer. As mentioned, these spurious direct coupled waves do not have the same transfer function, and, therefore, their contribution to the coupled signal alters the effective transfer function.

OBJECTS OF THE INVENTION

Accordingly, it is an object of the present invention to provide an improved multistrip coupled SWIF device.

It is a further object of the present invention to provide a multistrip coupled SWIF device having reduced side lobe response and increased trap depth.

SUMMARY OF THE INVENTION

A multistrip coupled acoustic surface wave filter has transmitting and receiving transducers formed on a piezoelectric substrate in offset alignment. A multistrip coupler converts surface waves launched by the transmitting transducer to impinge the offset receiving transducer. Isolating barrier means interposed on the substrate surface between the transducers prevent direct coupling of surface waves propagating along other than the primary axis of the transmitting transducer.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

DESCRIPTION OF THE PREFERRED EMBODIMENTS

Figure 1:
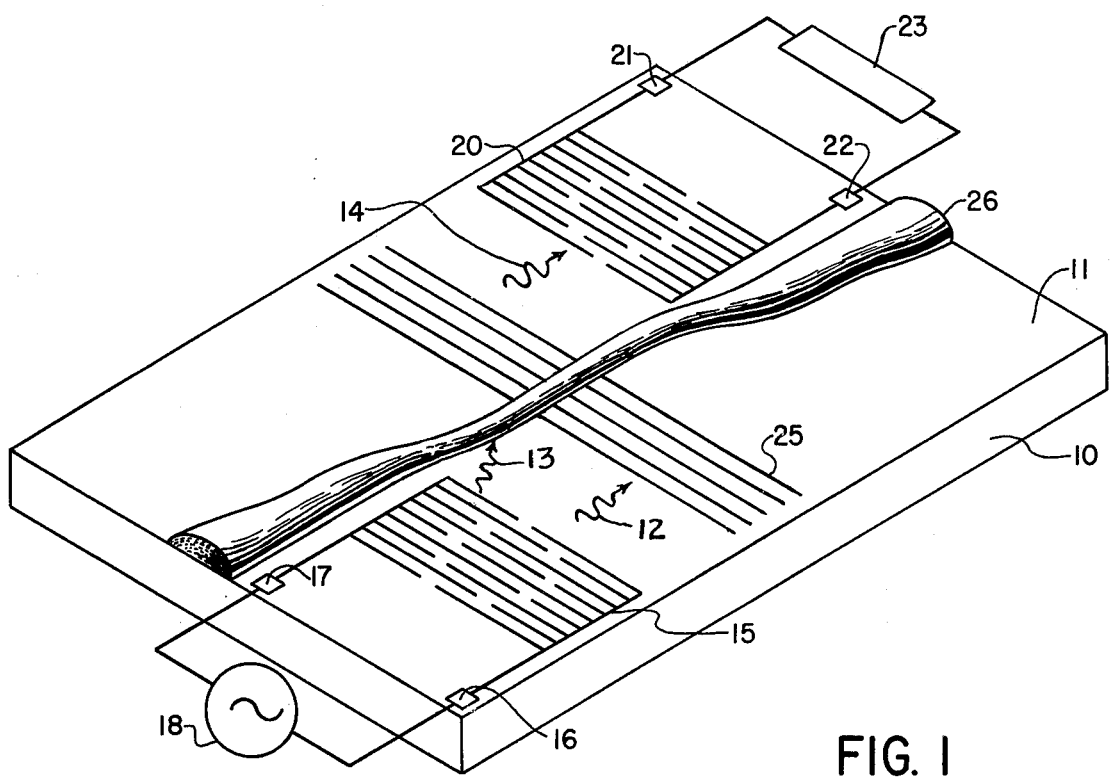
FIG. 1 is a drawing of a SWIF device constructed in accordance with one embodiment of the present invention.

FIG. 1 shows an acoustic surface wave device constructed in accordance with the present invention. A piezoelectric substrate 10 defines a propagating surface 11 upon which an apodized transmitting transducer 15 comprising a pair of comb-like elements 16 and 17 having fingers of varied lengths are formed. A source of electrical signal 18 is coupled to transducer elements 16 and 17. An apodized receiving transducer 20 comprising a second pair of conductive comb-like elements 21 and 22 each having fingers of varied lengths is also deposited on surface 11 and is coupled to a load impedance 23. While transducers 15 and 20 are shown apodized, it should be obvious that uniform fingered transducers (either or both) can be used and would realize the benefits of the present invention. A multistrip coupler 25 comprising a plurality of elongated conductive elements is deposited on surface 11 and interposed between transducers 15 and 20. Transducers 15 and 20 together with multistrip coupler 25 form the main energy coupling path between source 18 and load 23. Barrier means 26 are formed by an elongated deposit of acoustically dampening material interposed between transducers 15 and 20 substantially orthogonal to multistrip coupler 25 and overlaying its center portion.

In operation, electriical signals applied to transducer 15 cause the surface 11 of substrate 10 to be cyclically stressed and deformed launching acoustic surface waves 12 which propagate outwardly from transducer 15 along its primary axis and impinge the elements of multistrip coupler 25. By the familiar multistrip coupler action, acoustic surface waves 12 emanating from transducer 15 produce a second succession of acoustic surface waves 14 propagating toward transducer 20. Because the transfer of energy occurs by electrical voltage between adjacent fingers of the coupler, the non-conductive mechanical barrier does not inhibit the transfer of electrical energy but does inhibit passage of acoustic energy. The mechanical energy present in the acoustic surface waves incident on transducer 20 is reconverted to electrical energy in the form of a voltage developed across load 23. The above-described operation is well known in the art and with the exception of interposed barrier means 26, the operation of the device shown in FIG. 1 is conventional. In addition, it is known in the art that the angle of primary axis propagation with respect to transducer and multistrip coupler elements is determined by the crystal structure of the propagation medium. The discussions which follow assume the primary axis of the transducers is orthogonal to their finger elements. It should be kept in mind, however, that the present invention is equally applicable to devices in which these angles are "skewed."

As mentioned, in addition to the above-described primary axis surface waves, acoustic energy is also emanating from transducer 15 in other directions. As is well known, multistrip couplers are effective only upon waves incident within a very narrow angular range (near 90° in the device of FIG. 1) and waves incident at angles substantially different propagate unperturbed through the multistrip coupler. This coupling does occur in prior art devices and would occur in the device of the present invention but for the imposition of barrier means 26. In the embodiment shown, barrier means 26 comprises a deposit of rubber cement placed on surface 11 after the transducers and multistrip coupler are formed. However, it should be apparent that many acoustic dampening materials, such as epoxy or black wax, could also be used to fabricate the barrier means. The acoustic dampening material of barrier means 26 absorbs the mechanical energy of non-primary axis surface waves 13 preventing them from reaching transducer 20. As a result of this wave absorption, the sole coupling mechanism between transducers 15 and 20 is via multistrip coupler 25 and comprises surface waves propagating along the primary axes of the two transducers.

Figure 2:
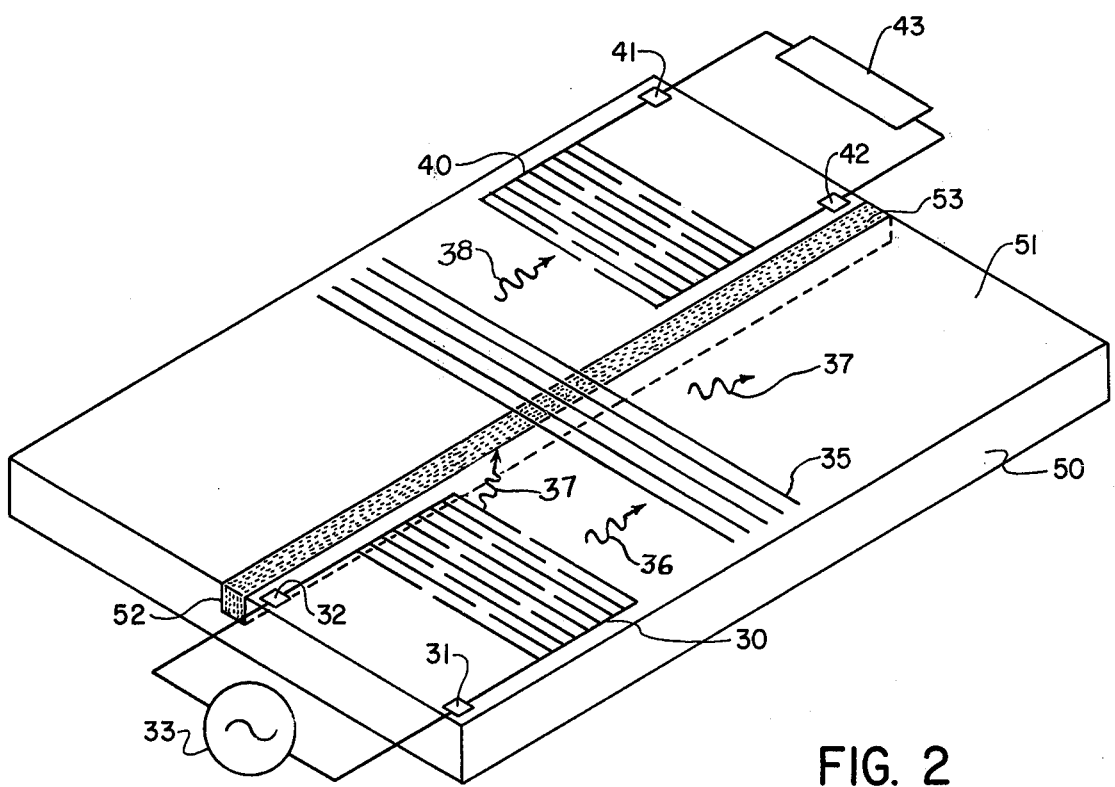
FIG. 2 is a drawing of a SWIF device constructed in accordance with another embodiment of the present invention.

FIG. 2 shows an alternate embodiment of the present invention in which a multistrip coupled SWIF having an apodized transmitting transducer 30 comprising conductive comb-like structures 31 and 32 having fingers of varied lengths and a receiving transducer 40 comprising comb-like conductive structures 41 and 42 having fingers of varied lengths together with a conductive multistrip coupler 35 are deposited upon surface 51 of substrate 50. In a manner similar to that described above in FIG. 1, transmitting transducer 30 is coupled to a source of electrical signal 33 and receiving transducer 40 to a load impedance 43. A barrier means 53 comprising an elongated deposit of acoustically reflective material is interposed between transducers 30 and 40 and is substantially orthogonal to multistrip coupler 35. In the embodiment shown, the substrate surface defines a groove 52 to accommodate the reflective material and the conductive elements of multistrip coupler 35 across over the barrier thus formed.

The operation of the device of FIG. 2 for primary axis surface waves is identical to that described above in FIG. 1. Also similar is the propagation of surface waves from transmitting transducer 30 along other than the primary axis which but for the action of interposed barrier 53 would impinge receiving transducer 40. Unlike the absorptive type barrier means 26 of FIG. 1, barrier means 53 in FIG. 2 provides an absorptive and reflective barrier. The material selected for barrier means 53 is non-conductive so as not to interfere with coupler action and has a mass density and surface wave propagating velocity characteristic which is substantially different than the material of substrate 50. Surface waves emanating from transducers 30 along other than the primary axis which in the absence of barrier means 53 would propagate to transducer 40 are instead reflected preventing them from reaching transducer 40 and contributing to the coupled signal. As a result, the sole coupling mechanism for surface waves between transducers 30 and 40 is via multistrip coupler 35. Further, only surface waves propagated along the primary axis of transducers 30 and 40 are so coupled.

Figure 3:
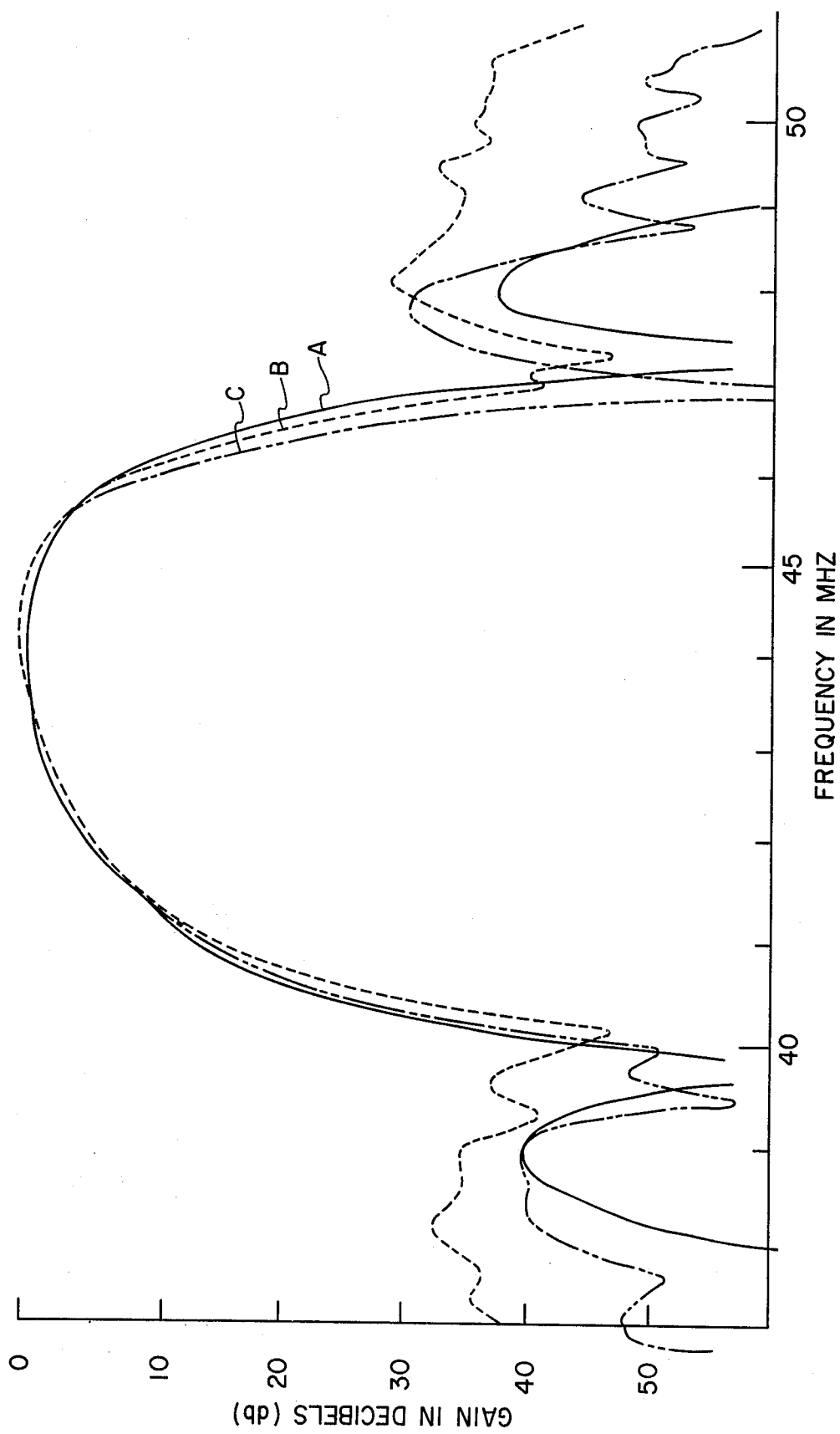
FIG. 3 shows transfer characteristics of both conventional and present invention SWIF devices together with the theorectically predicted transfer characteristic.

FIG. 3 shows experimentally derived transfer function curves of SWIF devices designed to function as intermediate frequency passband filters for a color television receiver together with a plot of the theoretically predicted response (curve A). Curve B shows the transfer function characteristic of a conventional sidestepping device not having the isolation barrier of the present invention while curve C shows the experimentally derived transfer function of a SWIF device constructed in accordance with the present invention having an absorbent or dampening type barrier. No experimental data is available for the embodiment shown in FIG. 2 in which a reflective type barrier is utilized. However, it is clear that the benefits achieved by the device of FIG. 1 would also be achieved by a device constructed in accordance with FIG. 2. Further, it should be obvious that, while the data derived is from a specific application of the present invention, it is equally applicable to numerous other devices.

Examination of FIG. 3 shows that the major passband responses for both the prior art device having no barrier (curve B) and the present invention device having an absorbent barrier (curve C) coincide very closely with the theoretical response of curve A. The transfer characteristic of the conventional device differs substantially from the predicted characteristic in the traps adjacent the major passband and in the regions of the upper and lower side lobes (above 47 MHz and below 40 MHz). In contrast, the response of the present invention device is very similar in the side lobe and adjacent trap regions to the predicted or calculated value shown by curve A of the prior art SWIF. The greater adjacent trap depth achieved by the present invention device maximizes its effectiveness in fulfilling its intended purpose, that is, a color television intermediate frequency filter. In such an application, it is intended that signals at the trap frequencies be adequately trapped to prohibit their interference with recovery of the desired information. The reduced trap depth of the conventional device will reduce its effectiveness in such an application. In addition to differences in the adjacent trap depths, the extended side lobe area of curve B indicates that signals at frequencies above 49 MHz and bellow 39 MHz (so-called out-of-band signals) are significantly more attenuated in the present invention device yielding improved filter selectivity.

What has been shown is an improved acoustic surface wave device having a transfer characteristic which is not significantly degraded by surface waves propagating in directions other than the primary axis.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:
1. An acoustic surface wave device comprising:
 a piezoelectric substrate defining a wave propagating surface;
 a transmitting and receiving transducer pair for launching and receiving acoustic surface waves, formed at offset positions on said surface, each including a plurality of interleaved conductive fingers and defining a primary axis of propagation and reception;
 a multistrip coupler, including elongated conductive elements, interposed between said transducers such that said elements are substantially parallel to said transducer fingers, converting surface waves launched by said transmitting transducer along its primary axis to waves along said primary axis of said offset receiving transducer; and
 barrier means in the main energy coupling path, interposed between said transducers, reducing propagation of surface waves between said transducers along directions other than said primary axes.

2. An acoustic surface wave device as set forth in claim 1, wherein said barrier means include:
 an elongate deposit of material having acoustic wave propagating characteristics substantially different than said substrate.

3. An acoustic surface wave device as set forth in claim 2, wherein said material has a substantially greater acoustic wave attenuation characteristic than said substrate.

4. An acoustic surface wave device as set forth in claim 3, wherein said substrate propagating surface defines an elongate groove interposed between said transducers and wherein said material occupies said groove.

5. An acoustic surface wave device as set forth in claim 2, wherein said material has different mass density and surface wave propagating velocity characteristics than said substrate causing surface waves emanating from either of said transducers along other than said primary axes to be substantially reflected away from said barrier means rather than coupled to the other of said transducers.

6. An acoustic surface wave device as set forth in claim 5, wherein said substrate propagating surface defines an elongate groove interposed between said transducers and wherein said material occupies said groove.

* * * * *